(12) United States Patent
Seki et al.

(10) Patent No.: US 10,593,606 B2
(45) Date of Patent: Mar. 17, 2020

(54) WIRING BOARD, AND MANUFACTURING METHOD

(71) Applicant: SONY CORPORATION, Tokyo (JP)

(72) Inventors: Kousuke Seki, Kanagawa (JP); Yusaku Kato, Kanagawa (JP); Shun Mitarai, Kanagawa (JP); Shinji Rokuhara, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 77 days.

(21) Appl. No.: 15/574,230

(22) PCT Filed: May 11, 2016

(86) PCT No.: PCT/JP2016/063957
§ 371 (c)(1),
(2) Date: Nov. 15, 2017

(87) PCT Pub. No.: WO2016/190100
PCT Pub. Date: Dec. 1, 2016

(65) Prior Publication Data
US 2018/0145004 A1    May 24, 2018

(30) Foreign Application Priority Data
May 25, 2015 (JP) .................................. 2015-105192

(51) Int. Cl.
*B32B 3/00* (2006.01)
*H01L 23/15* (2006.01)
(Continued)

(52) U.S. Cl.
CPC .............. *H01L 23/15* (2013.01); *H01L 23/32* (2013.01); *H01L 23/36* (2013.01); *H05K 1/056* (2013.01);
(Continued)

(58) Field of Classification Search
None
See application file for complete search history.

(56) References Cited

U.S. PATENT DOCUMENTS

| | | | | |
|---|---|---|---|---|
| 4,547,625 A | * | 10/1985 | Tosaki | .................... C03C 3/108 156/89.11 |
| 2002/0005295 A1 | * | 1/2002 | Mizutani | ................ H05K 1/162 174/262 |

(Continued)

FOREIGN PATENT DOCUMENTS

| | | |
|---|---|---|
| JP | 2002-76538 A | 3/2002 |
| JP | 2007-59874 A | 3/2007 |

(Continued)

OTHER PUBLICATIONS

International Search Report prepared by the Japan Patent Office dated May 17, 2016, for International Application No. PCT/JP2016/063957.

*Primary Examiner* — Seth Dumbris
(74) *Attorney, Agent, or Firm* — Sheridan Ross P.C.

(57) ABSTRACT

The present disclosure relates to a wiring board and a manufacturing method that simultaneously solve problems of stress and heat release A wiring board as one aspect of the present disclosure includes a glass substrate as a core member, and a plurality of through holes arranged in a cyclic manner in the glass substrate. The through holes are filled with different kinds of filling materials. A wiring board manufacturing method as one aspect of the present disclosure includes: a through hole formation step of forming through holes arranged in a cyclic manner in a glass substrate serving as a core member; and a filling step of forming a protecting sheet on the glass substrate, and filling through holes with a filling material through openings formed in the protecting sheet. The present disclosure can be applied to a (Continued)

wiring board that has a through-electrode-equipped glass substrate as the core member.

14 Claims, 12 Drawing Sheets

(51) Int. Cl.
| | |
|---|---|
| *H01L 23/32* | (2006.01) |
| *H01L 23/36* | (2006.01) |
| *H05K 1/11* | (2006.01) |
| *H05K 1/05* | (2006.01) |
| *H05K 3/42* | (2006.01) |
| *H05K 3/44* | (2006.01) |
| *H05K 1/09* | (2006.01) |

(52) U.S. Cl.
CPC ............... *H05K 1/11* (2013.01); *H05K 3/426* (2013.01); *H05K 3/445* (2013.01); *H01L 2224/16225* (2013.01); *H05K 1/095* (2013.01); *H05K 2201/026* (2013.01); *H05K 2201/0323* (2013.01); *H05K 2201/0959* (2013.01)

(56) References Cited

U.S. PATENT DOCUMENTS

| | | |
|---|---|---|
| 2007/0023202 A1 | 2/2007 | Shibata et al. |
| 2007/0102663 A1* | 5/2007 | Xiao ..................... B82Y 25/00 252/62.51 C |
| 2007/0152194 A1* | 7/2007 | Natekar ................. B82Y 10/00 252/500 |
| 2010/0139088 A1 | 6/2010 | Shibata et al. |
| 2012/0075216 A1 | 3/2012 | Black et al. |
| 2012/0168206 A1 | 7/2012 | Sekine et al. |

FOREIGN PATENT DOCUMENTS

| | | |
|---|---|---|
| JP | 2012-119611 | 6/2012 |
| JP | 2013-8940 A | 1/2013 |
| JP | 2013-518433 | 5/2013 |
| JP | 2013-538010 A | 10/2013 |

* cited by examiner

FIG. 7
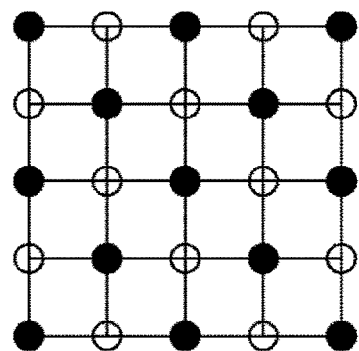
A
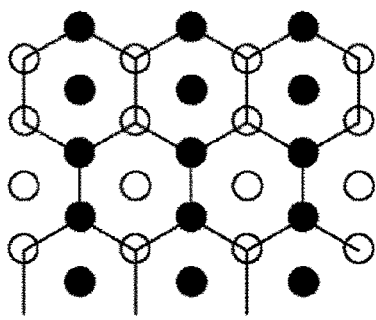
B

10,593,606 B2

WIRING BOARD, AND MANUFACTURING METHOD

CROSS REFERENCE TO RELATED APPLICATIONS

This application is a national stage application under 35 U.S.C. 371 and claims the benefit of PCT Application No. PCT/JP2016/063957 having an international filing date of 11 May 2016, which designated the United States, which PCT application claimed the benefit of Japanese Patent Application No. 2015-105192 filed 25 May 2015, the disclosures of which are incorporated herein by reference in their entirety.

TECHNICAL FIELD

The present disclosure relates to wiring boards and manufacturing methods, and more particularly, to a wiring board and a manufacturing method that excel in stress and heat release during the high temperature processes at the time of manufacturing.

BACKGROUND ART

A large number of semiconductor components (such as LSI chips) are used in the electronic devices currently on the market.

In normal circumstances, a semiconductor component is temporarily mounted on a wiring board (hereinafter also referred to as an interposer) for packaging, and the wiring board is connected, together with other parts and the like, onto a mother board.

Conventionally, a wiring board has a core member that is an organic substrate formed with glass epoxy, a silicon substrate made of silicon, or the like. However, with an organic substrate or a silicon substrate, it has been gradually becoming difficult to cope with reductions in the sizes of the semiconductor components. Therefore, a wiring board having a glass substrate as its core member is now often used so that the sizes of wirings can be reduced.

FIG. 1 shows an example structure of a through-electrode-equipped wiring board in which a glass substrate is used as the core member. As shown in the drawing, in a through-electrode-equipped wiring board 10, a glass substrate 13 is used as the core member, and wiring layers 12 and 15 are formed on both surfaces of the glass substrate 13. Further, through electrodes 14 filled with a conductive metal such as copper (Cu) are provided in the glass substrate 13, and the wiring layers 12 and 15 are electrically connected to each other by the through electrodes 14. Semiconductor components 16 are connected to the wiring layer 12.

As described above, as the glass substrate 13 is used as the core member, the wirings can be made smaller in size in the through-electrode-equipped wiring board 10. In the through-electrode-equipped wiring board 10, however, problems of stress and heat release might be caused by the material (glass) of the core member and the material (Cu in this case) of the through electrodes 14.

As for a specific example of the problem of stress, cracks might be caused in the glass substrate 13 by the stress generated due to the existence of a one-digit difference in coefficient of linear expansion (CTE) between the glass substrate 13 and the through electrodes (Cu) 14 during the high-temperature process performed to form the wiring layers 12 and 15 and mount the semiconductor components 16 onto the glass substrate 13.

CTE of glass: 7.5 [$10^{-6}$/K]
CTE of Cu: 14.3 [$10^{-6}$/K]

As for a specific example of the problem of heat release, the heat release rate of glass is lower than that of silicon, and therefore, the heat release that can be conducted in a case where a silicon substrate is used cannot be appropriately conducted in a case where a glass substrate is used. This causes failure.

Thermal expansion rate of silicon: 188 [W/mK]
Thermal expansion rate of glass: 1 [W/mK]

It should be noted that, to solve the problem of stress, a method has been suggested. According to this method, a metal paste that has a small CTE difference from glass and is formed with metal particles, a resin binder, and a solvent is used as the material of the through electrodes to be formed in a glass substrate (see Patent Document 1, for example).

Meanwhile, to solve the problem of heat release, there has been a suggested method by which dummy through electrodes that function as a heat dissipation path are used as well as active through electrodes that function as an electrical connection path (see Patent Document 2, for example).

CITATION LIST

Patent Documents

Patent Document 1: JP 2012-119611 A
Patent Document 2: JP 2013-518433 A

SUMMARY OF THE INVENTION

Problems to be Solved by the Invention

As described above, the problems of stress and heat release that might be caused in a through-electrode-equipped wiring board in which a glass substrate is used as the core member can be solved by separate methods, but these methods cannot be combined in a simple manner. Therefore, there is a demand for a method that can solve the problems of stress and heat release at the same time.

The present disclosure is made in view of the above circumstances, and is to simultaneously solve the problems of stress and heat release that might be caused in a through-electrode-equipped wiring board in which a glass substrate is used as the core member.

Solutions to Problems

A wiring board as one aspect of the present disclosure includes a glass substrate as a core member, and a plurality of through holes arranged in a cyclic manner in the glass substrate. In this wiring board, the through holes are filled with different kinds of filling materials.

In the glass substrate, through hole groups each formed with a plurality of through holes filled with different kinds of filling materials may be arranged in a cyclic manner.

The wiring board as one aspect of the present disclosure may further include a normal through electrode formed with the through hole filled with a first conductive material.

The wiring board as one aspect of the present disclosure may further include a dummy through electrode formed with the through hole not filled with filling conductivity.

The wiring board as one aspect of the present disclosure may further include a low-expansion through electrode formed with the through hole filled with a second conductive material, the second conductive material having a linear expansion coefficient closer to the linear expansion coefficient of glass than to the linear expansion coefficient of the first conductive material.

The first conductive material may be Cu, and the second conductive material may be W.

The normal through electrodes and the low-expansion through electrodes may be arranged in a cyclic and symmetric manner.

The normal through electrodes and the low-expansion through electrodes may be alternately arranged at corners of squares arranged in horizontal and vertical directions.

The normal through electrodes and the low-expansion through electrodes may be alternately arranged at corners and centers of regular hexagons arranged without space.

The wiring board as one aspect of the present disclosure may further include a heat-release through electrode formed with the through hole filled with a carbon-based material or a metal material having a low thermal expansion rate and a higher thermal conductivity than the thermal conductivity of glass.

The carbon-based material may be carbon nanotube.

The wiring board as one aspect of the present disclosure may further include a magnetic through electrode formed with the through hole filled with a magnetic material.

The magnetic material may be an iron oxide, a chromium oxide, cobalt, or a ferrite.

A wiring board manufacturing method as one aspect of the present disclosure includes: a through hole formation step of forming a plurality of through holes arranged in a cyclic manner in a glass substrate serving as a core member; and a filling step of forming a protecting sheet on the glass substrate, and filling the through holes with a filling material through an opening formed in the protecting sheet, the protecting sheet being formed for each kind of filling materials to fill the through holes, each protecting sheet having an opening only for the through holes to be filled with the corresponding one of the filling materials.

Effects of the Invention

According to one aspect of the present disclosure, problems of stress and heat release in a through-electrode-equipped wiring board in which a glass substrate is used as the core member can be solved at the same time.

BRIEF DESCRIPTION OF DRAWINGS

FIG. 7 is a diagram showing modifications of arrangement of through electrodes in a unit cell.

MODES FOR CARRYING OUT THE INVENTION

The following is a detailed description of the best mode for carrying out the present disclosure (hereinafter referred to as the embodiment), with reference to the drawings.

<Example Structure of a Through-Electrode-Equipped Wiring Board as an Embodiment of the Present Disclosure>

Figure 1:
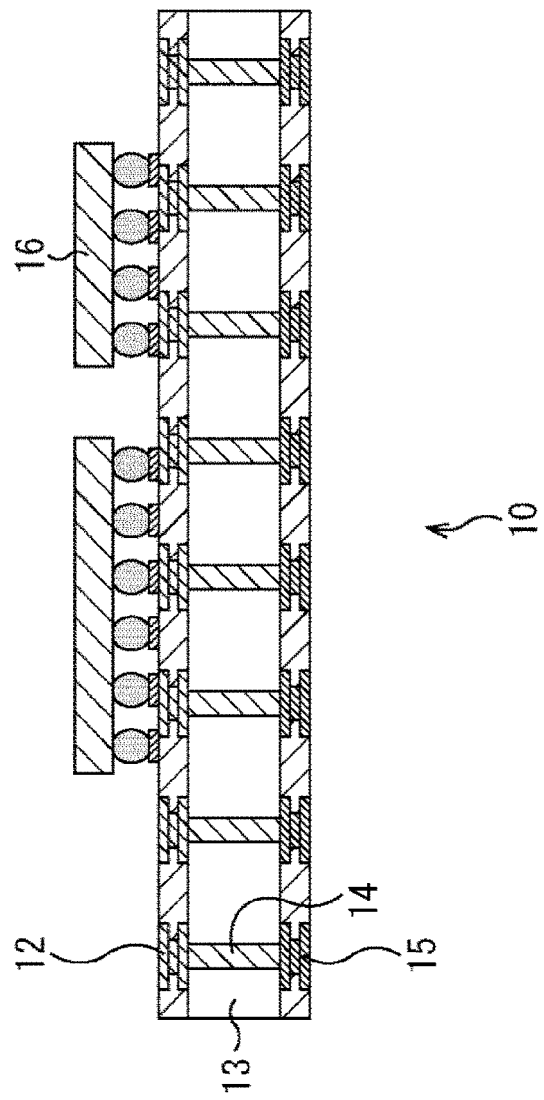
FIG. 1 is a cross-sectional view of an example structure of a through-electrode-equipped wiring board in which a glass substrate is used as a core member.
Figure 2:
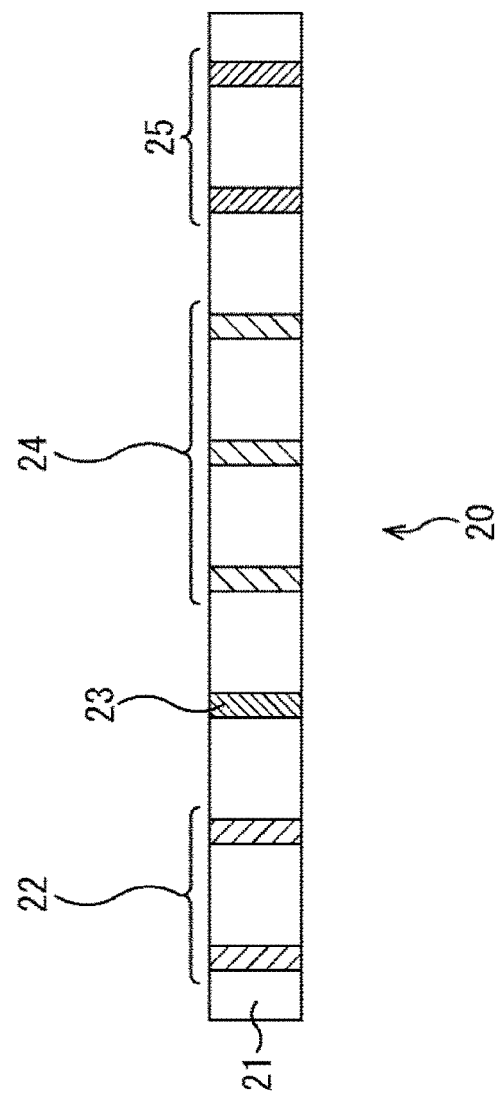
FIG. 2 is a cross-sectional view of an example structure of a through-electrode-equipped wiring board to which the present disclosure is applied.

FIG. 2 shows an example structure of a through-electrode-equipped wiring board as an embodiment of the present disclosure.

In a through-electrode-equipped wiring board 20, a glass substrate 21 is used as the core member, and a wiring layer (not shown) is formed on at least one of the two surfaces of the glass substrate 21. Further, in the glass substrate 21, a plurality of through holes (hereinafter also referred as vias) are formed, and the respective through holes are filled with different materials depending on the positions and the purposes of use, so that heat-release through electrodes 22, low-expansion through electrodes 23, normal through electrodes 24, and magnetic through electrodes 25 are formed.

The heat-release through electrodes 22 are formed with through holes filled with a carbon-based material, such as carbon nanotube (CNT), which has a low thermal expansion rate and has a higher thermal conductivity than glass. However, a metal may be used as the material of the heat-release through electrodes 22. The heat-release through electrodes 22 are formed at the locations that need to release heat, and are connected to heat release plates. As the heat-release through electrodes 22 are formed in the glass substrate 21, the problem of heat release in the glass substrate 21 can be reduced.

The low-expansion through electrodes 23 are formed with through holes each filled with a low-CTE material such as tungsten (W), which has a lower CTE than Cu. The normal through electrodes 24 are formed with through holes filled with a widely-used conductive metal material such as Cu. As the low-expansion through electrode 23 and the normal through electrodes 24 are evenly arranged in the glass substrate 21, the problem of stress on the glass substrate 21 can be reduced.

The magnetic through electrodes 25 are formed with through holes filled with a magnetic material such as an iron oxide, a chromium oxide, cobalt, or a ferrite. The magnetic through electrodes 25 are, for example, formed as a shield for eliminating the influence of a magnetic field generated from a coil or the like on the semiconductor components disposed in the vicinity thereof. It should be noted that the through electrode group consisting of the heat-release through electrodes 22, the low-expansion through electrode 23, the normal through electrodes 24, and the magnetic through electrodes 25 may be arranged cyclically in the glass substrate 21.

<Method of Manufacturing the Through-Electrode-Equipped Wiring Board as an Embodiment of the Present Disclosure>

Figure 3:
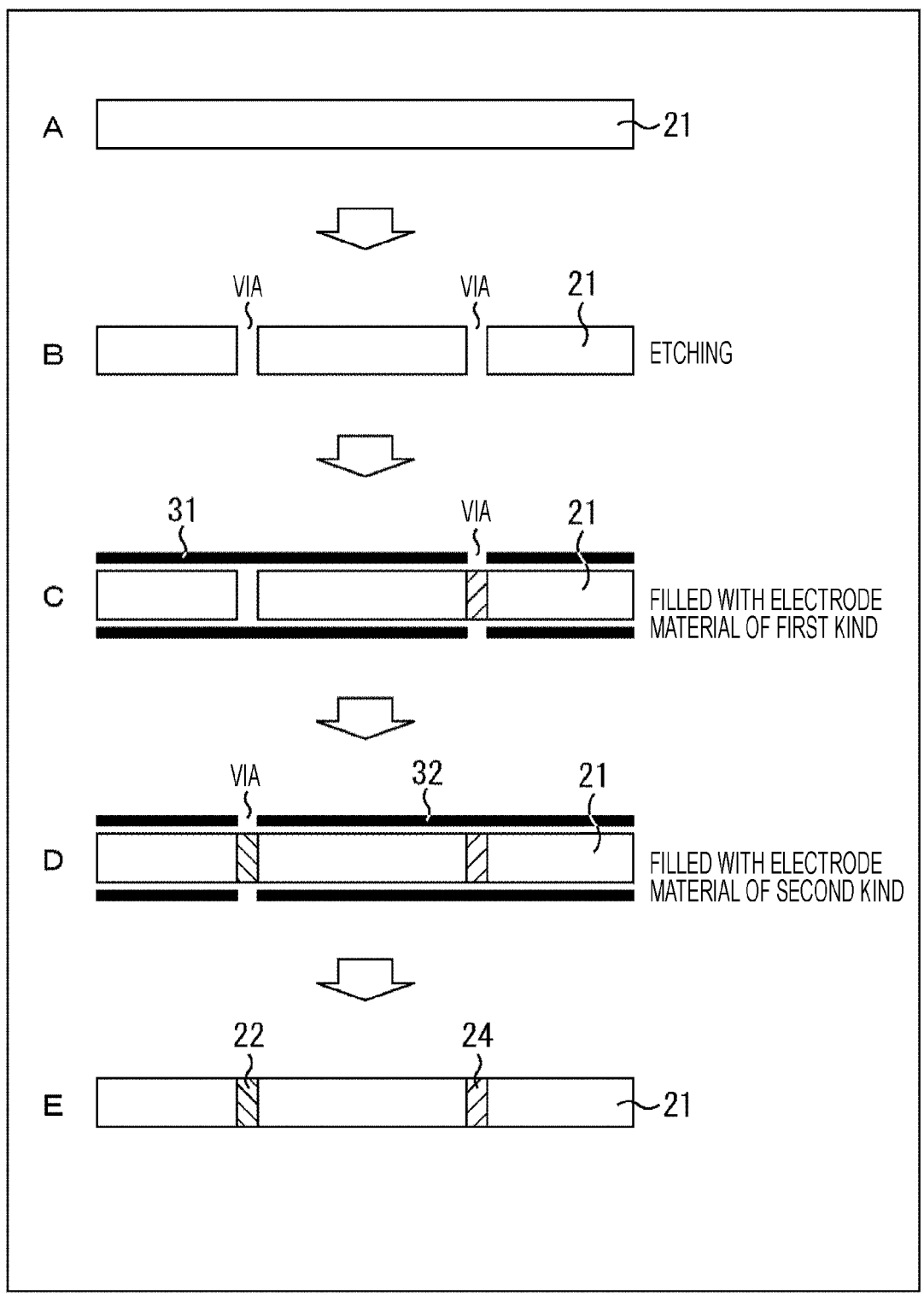
FIG. 3 is a diagram for explaining a method of manufacturing the through-electrode-equipped wiring board to which the present disclosure is applied.

Next, FIG. 3 shows the procedures for forming two kinds of through electrodes (the heat-release through electrodes 22 and the normal through electrodes 24) in the glass substrate 21, of the procedures for manufacturing the through-electrode-equipped wiring board 20.

In the glass substrate 21 shown in A of FIG. 3, through holes (vias) are formed by etching with a laser or the like at the positions where through electrodes are to be formed, as shown in B of FIG. 3.

As shown in C of FIG. 3, a mask 31 having openings only at the portions where through electrodes of a first kind (the normal through electrodes 24, for example) are to be formed is then formed on the surface of the glass substrate 21, and the vias are filled with the material (Cu, for example) of the through electrodes of the first kind. It should be noted that the vias may be filled with filling materials by a full-filling method, a conformal method, or the like.

As shown in D of FIG. 3, after the mask 31 is removed, a mask 32 having openings only at the portions where through electrodes of a second kind (the heat-release through electrodes 22, for example) are to be formed is then formed on the surface of the glass substrate 21, and the vias are filled with the material (CNT, for example) of the through electrodes of the second kind.

Lastly, the mask 32 is removed, as shown in E of FIG. 3. As the above procedures are carried out, the glass substrate 21 having two kinds of through electrodes (the heat-release through electrodes 22 and the normal through electrodes 24) formed therein can be obtained.

It should be noted that one or more procedures similar to the procedure shown in C of FIG. 3 are additionally carried out, so that the glass substrate 21 having three or more kinds of through electrodes formed therein can be obtained.

<Modification of the Through-Electrode-Equipped Wiring Board as an Embodiment of the Present Disclosure>

Figure 4:
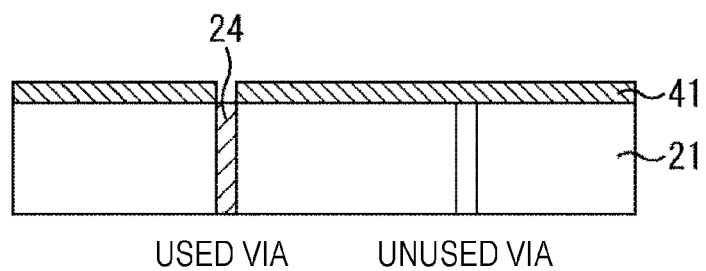
FIG. 4 is a diagram for explaining a method of manufacturing the through-electrode-equipped wiring board to which the present disclosure is applied.

Next, FIG. 4 shows a modification of the through-electrode-equipped wiring board 20. As in the modification illustrated in FIG. 4, not all the through holes formed in the glass substrate 21 need to be used as used vias (such as the normal through electrodes 24), and there may be unused vias that are not filled with any filling material and remain as hollows. It should be noted that an insulating film 41 is formed on the surface of the glass substrate 21. In the insulating film 41, the positions of the used vias are opened, and the positions of the unused vias are closed. In a case where a wiring layer is formed on the surface of the glass substrate 21, the wiring layer should be formed on the insulating film 41.

<Arrangement of Through Electrodes with Different Filling Materials>

Next, arrangement of through electrodes with different filling materials is described.

Figure 5:
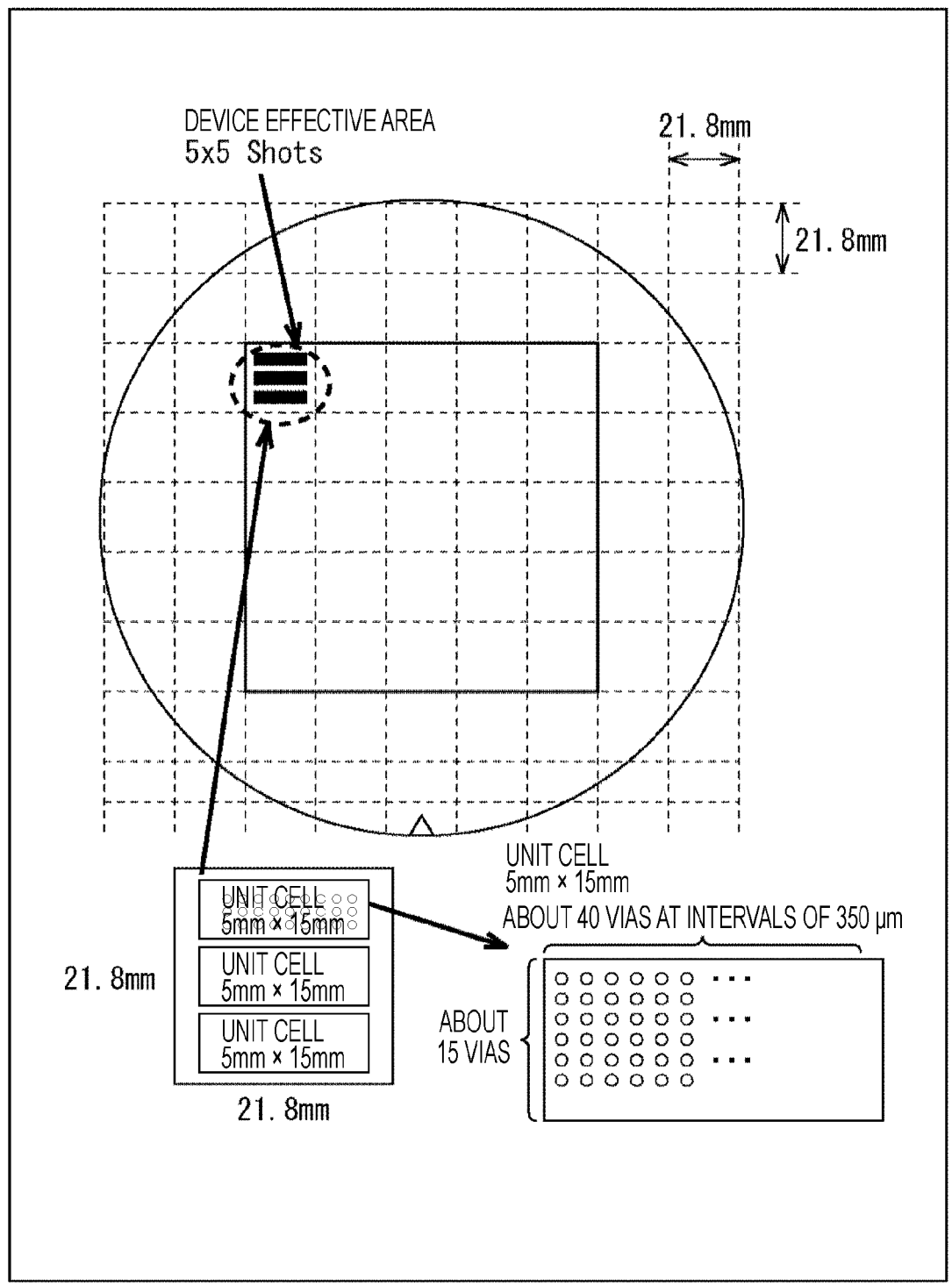
FIG. 5 is a diagram showing arrangement on a glass substrate scribed on a wafer.

FIG. 5 shows arrangement on a glass substrate scribed on a wafer. In the case shown in FIG. 5, 25 (=5×5) square shots of 21.8 mm are arranged in a device effective area of an 8-inch wafer. In each shot, three unit cells each having a wiring area of 5×15 mm are formed. In each unit cell, through electrodes of 65 µm in diameter are arranged in approximately 15 rows and approximately 40 columns at intervals of 350 µm. Here, each unit cell is equivalent to a glass substrate serving as the core member of a through-electrode-equipped wiring board.

Figure 6:
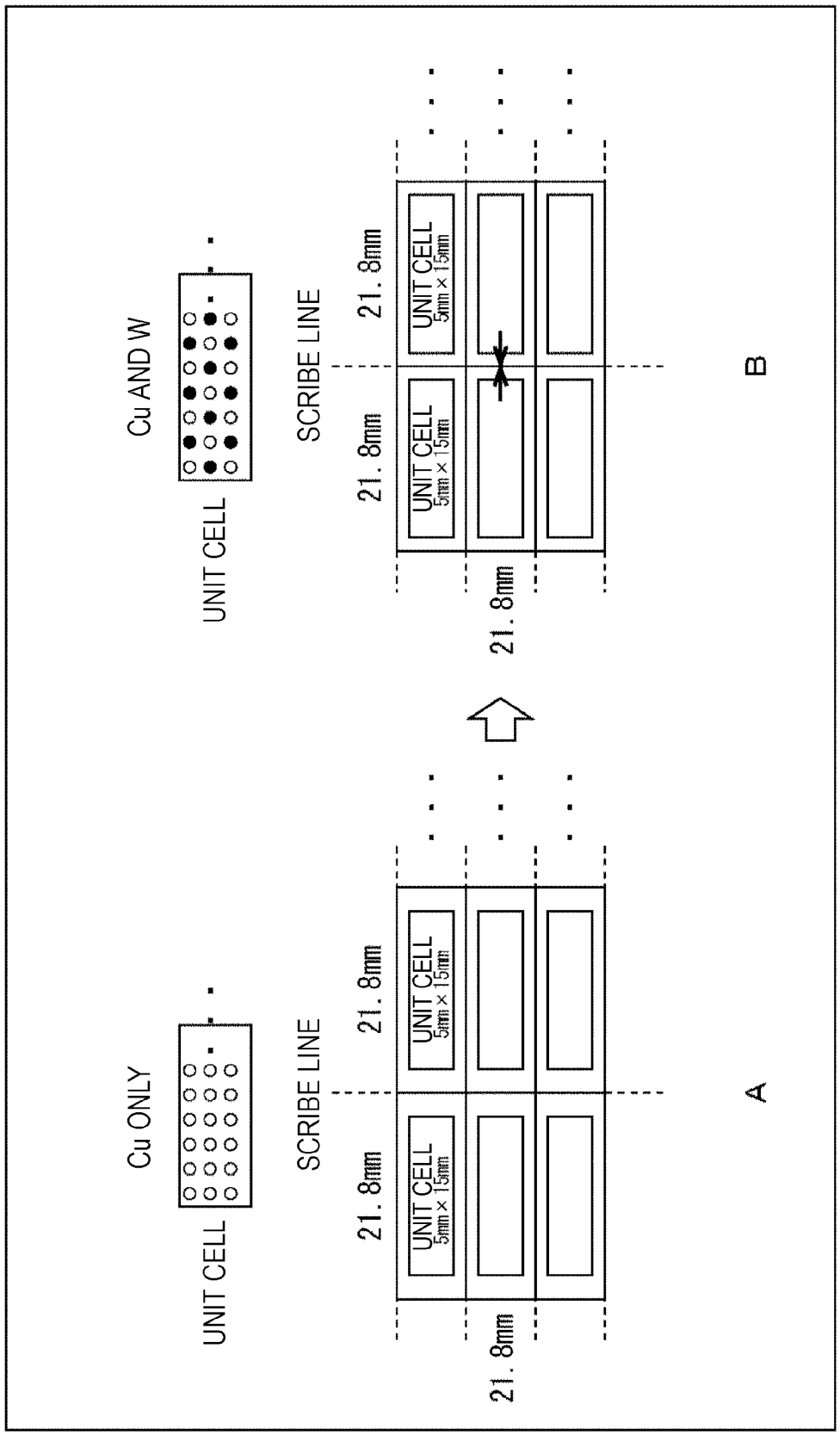
FIG. 6 is a diagram showing examples of arrangement of through electrodes in a unit cell.

FIG. 6 shows examples of arrangement of through electrodes in each unit cell. A of FIG. 6 shows a case where only one kind of through electrodes (normal through electrodes 24) are arranged in each unit cell. B of FIG. 6 shows a case where two kinds of through electrodes (low-expansion through electrodes 23 and normal through electrodes 24) are arranged in each unit cell.

Where the low-expansion through electrodes 23 made of W or the like and the normal through electrodes 24 made of Cu or the like are alternately arranged in a unit cell as shown in B of FIG. 6, the stress applied to the area surrounding the unit cell during the high-temperature process among the manufacturing procedures can be reduced. Thus, the distance between the unit cells scribed on adjacent shots respectively can be made shorter than that in the case shown in A of FIG. 6.

It should be noted that, in an example case where two kinds of through electrodes (low-expansion through electrodes 23 and normal through electrodes 24) are arranged in a unit cell, the low-expansion through electrodes 23 and the normal through electrodes 24 may be alternately arranged at the corners of squares arranged in rows and columns as shown in A of FIG. 7, or the low-expansion through electrodes 23 and the normal through electrodes 24 may be alternately arranged at the corners and the centers of regular hexagons arranged without any space as shown in B of FIG. 7.

Next, results of simulations of stress distributions in cases where two kinds of through electrodes (low-expansion through electrodes 23 and normal through electrodes 24) are arranged in the glass substrate 21 are described with reference to FIG. 8.

Figure 8:
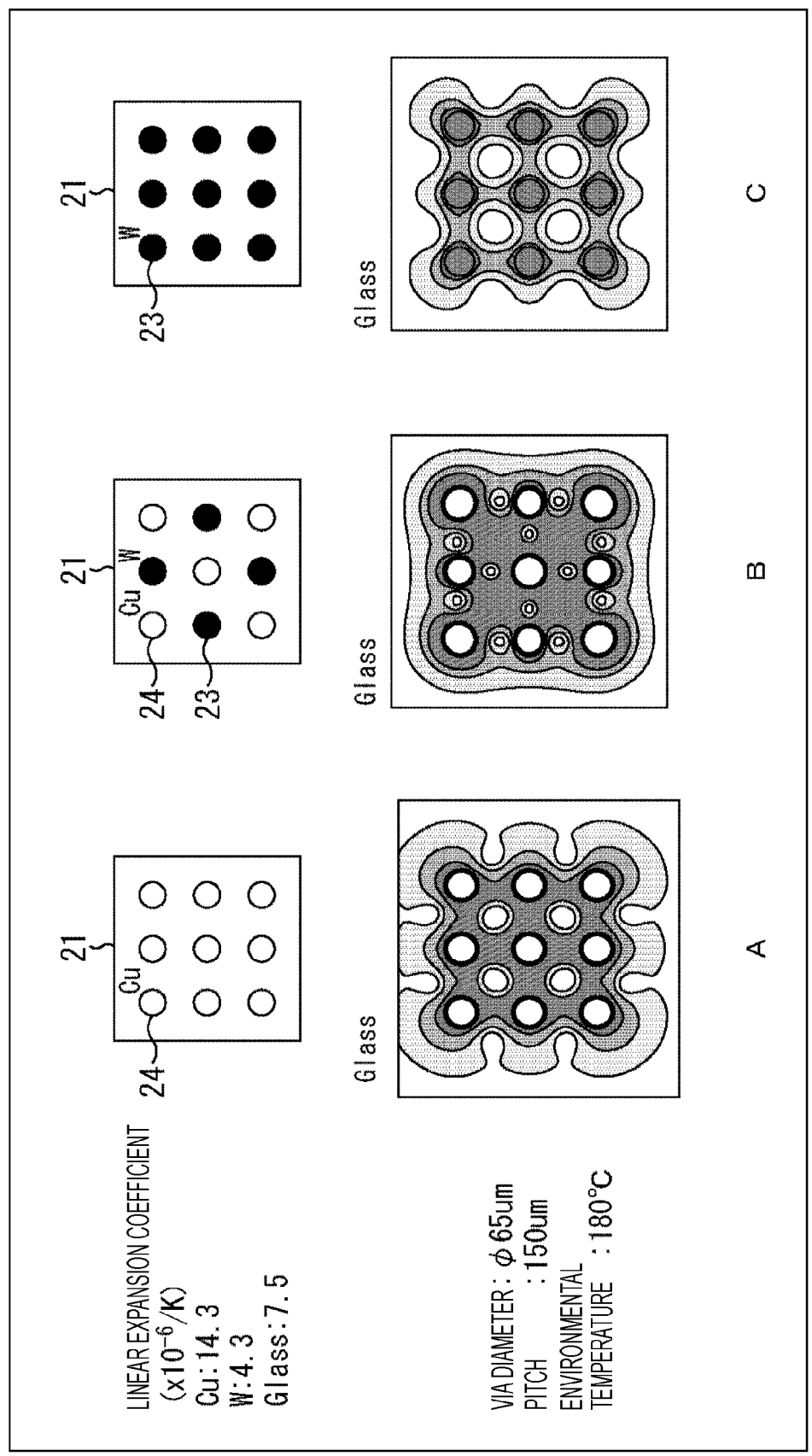
FIG. 8 is a diagram showing results of simulations of stress in cases where two kinds of through electrodes are arranged.

It should be noted that A of FIG. 8 shows the results of a simulation of stress in a case where only normal through electrodes 24 are arranged, B of FIG. 8 shows the results of a simulation of stress in a case where low-expansion through electrodes 23 and normal through electrodes 24 are arranged, and C of FIG. 8 shows the results of a simulation of stress in a case where only low-expansion through electrodes 23 are arranged.

However, the simulation conditions are such that the filling material of the low-expansion through electrodes 23 arranged in the glass substrate 21 is W while the filling material of the normal through electrodes 24 is Cu. The linear expansion coefficients of glass, W, and Cu are 7.5, 4.3, and 14.3 [$\times 10^{-6}$/K], respectively. The low-expansion through electrodes 23 and the normal through electrodes 24 have the same diameter (65 µm) and the same pitch (150 µm). The temperature is in the range of normal temperature of 25° C. to 180° C.

In the case where the low-expansion through electrodes 23 and the normal through electrodes 24 are arranged as shown in B of FIG. 8, and the case where only the low-expansion through electrodes 23 are arranged as shown in C of FIG. 8, the distributions of stress are smaller than that in the case where only the normal through electrodes 24 are arranged as shown in A of FIG. 8. Accordingly, where the low-expansion through electrodes 23 and the normal through electrodes 24 are arranged as shown in B of FIG. 8, the stress to be applied to the area surrounding the unit cell can be reduced during the high-temperature process in the manufacturing of the glass substrate, and the unit cells on the wafer can be arranged at shorter intervals.

It should be noted that, in the case where only the low-expansion through electrodes 23 are arranged as shown in C of FIG. 8, the electrical resistance of W (the electrical resistivity at 20° C. being 52.8 [nΩ·m]) is high, and therefore, degradation of electrical characteristics is predicted. Therefore, to reduce stress and prevent degradation of electrical characteristics, the low-expansion through electrodes 23 and the normal through electrodes 24 (the electrical resistivity of Cu at 20° C. being 16.78 [nΩ·m]) are preferably arranged as shown in B of FIG. 8.

<Example Applications of Heat-Release Through Electrodes 22>

Next, example applications of heat-release through electrodes 22 are described.

Figure 9:
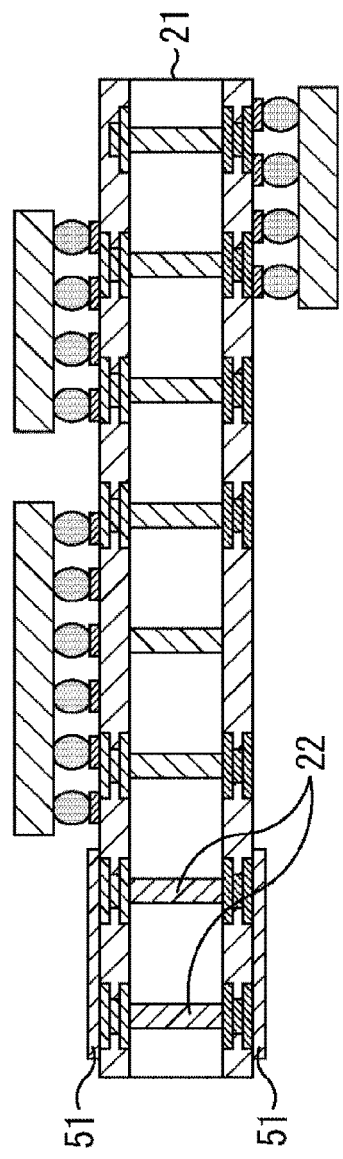
FIG. 9 is a diagram showing an example application of heat-release through electrodes.

FIG. 9 shows an example application of heat-release through electrodes 22 to heat release plates. As shown in the drawing, heat-release through electrodes 22 connected to semiconductor components or metal wirings that can be heat sources are connected to heat release plates 51 made of a metal or the like, so that generated heat can be efficiently released. It should be noted that the heat release plates 51 do not need to be electrically connected to the heat-release through electrodes 22, and the heat-release through electrodes 22 do not need to be electrically connected to the heat sources.

Figure 10:
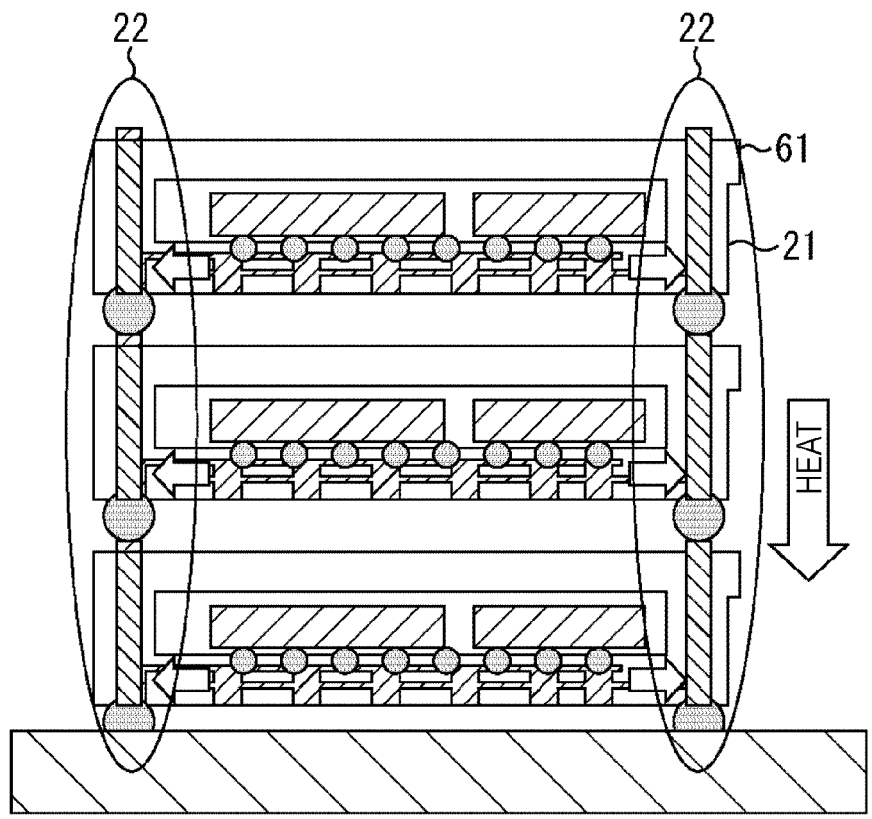
FIG. 10 is a diagram showing an example application of heat-release through electrodes.
Figure 11:
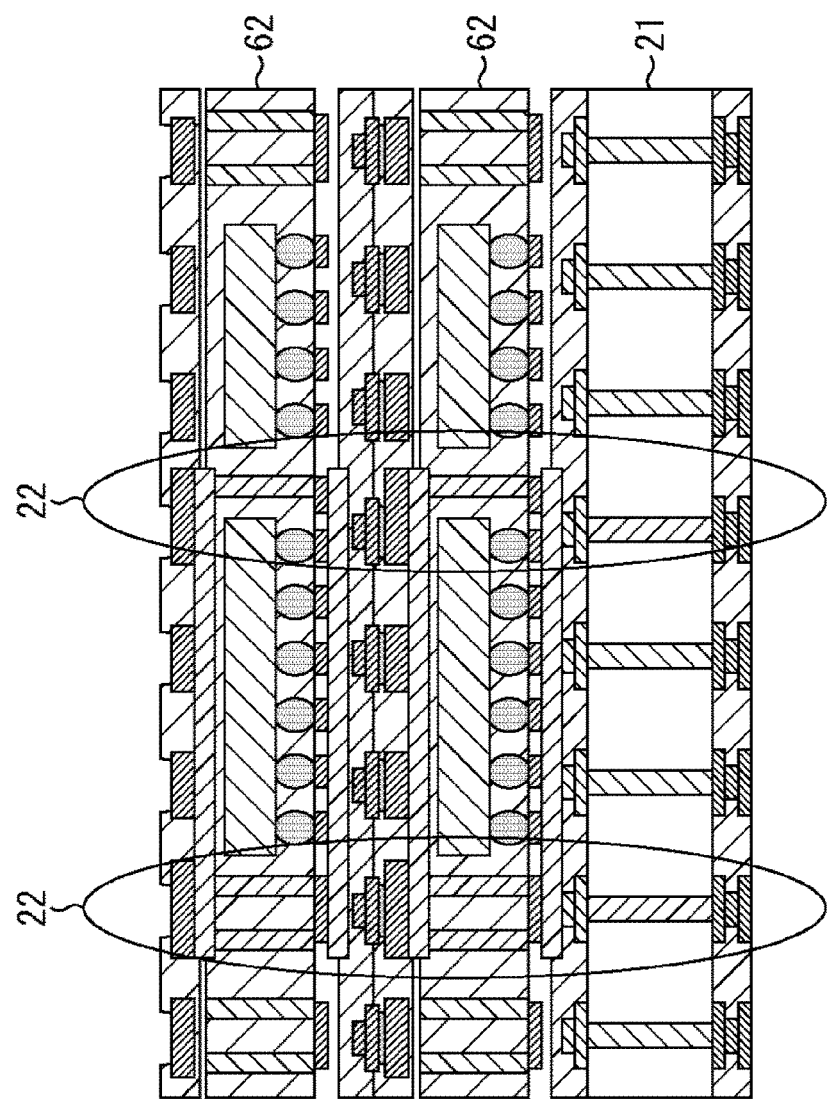
FIG. 11 is a diagram showing an example application of heat-release through electrodes.

FIGS. 10 and 11 show example applications of heat-release through electrodes 22 to stacked glass substrates 21.

As shown in FIG. 10, package substrates each formed with a glass substrate 21 and a glass cover 61 placed on the glass substrate 21 may be stacked to form heat-release through electrodes 22 at outer portions of the package substrates. With this arrangement, generated heat can be efficiently released.

Also, as shown in FIG. 11, a glass substrate 21 and molded resins 62 may be stacked to form heat-release through electrodes 22 in the vicinities of semiconductor components or the like that can be heat sources. With this arrangement, generated heat can be efficiently released.

<Example Application of Magnetic Through Electrodes 25>

Figure 12:
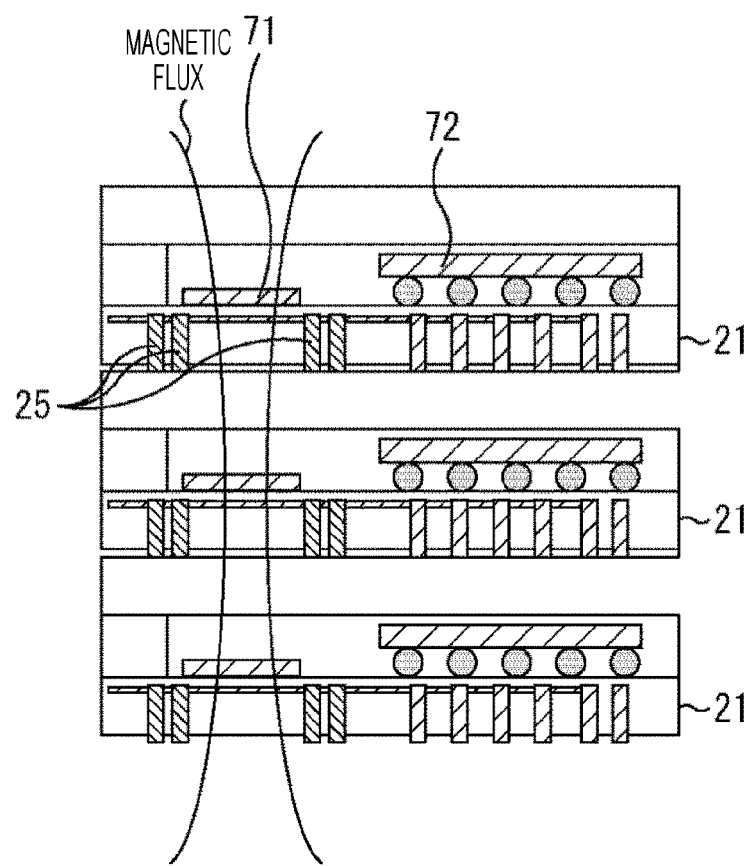
FIG. 12 is a diagram showing an example application of magnetic through electrodes.

Next, FIG. 12 shows an example application of magnetic through electrodes 25. As shown in the drawing, in a case where glass substrates 21 in which coils 71 and communication ICs 72 are mounted for current coupling communication are stacked, and inter-board communication is conducted, magnetic through electrodes 25 may be formed around the coils 71. With this arrangement, the influence of magnetic fields generated from the coils 71 on the adjacent circuits (such as the communication ICs 72) can be eliminated.

It should be noted that embodiments of the present disclosure are not limited to the above described embodiment, and various modifications may be made to the embodiment without departing from the scope of the present disclosure.

The present disclosure can be embodied in the following structures.

(1) A wiring board including:
a glass substrate as a core member; and
a plurality of through holes arranged in a cyclic manner in the glass substrate,
in which the through holes are filled with different kinds of filling materials.

(2) The wiring board according to (1), in which through hole groups each formed with the through holes filled with different kinds of filling materials are arranged in acyclic manner in the glass substrate.

(3) The wiring board according to (1) or (2), further including
a normal through electrode formed with the through hole filled with a first conductive material.

(4) The wiring board according to any of (1) to (3), further including
a dummy through electrode formed with the through hole not filled with filling conductivity.

(5) The wiring board according to any of (1) to (4), further including
a low-expansion through electrode formed with the through hole filled with a second conductive material, the second conductive material having a linear expansion coefficient closer to a linear expansion coefficient of glass than to a linear expansion coefficient of the first conductive material.

(6) The wiring board according to (5), in which
the first conductive material is Cu, and
the second conductive material is W.

(7) The wiring board according to (5) or (6), in which the normal through electrodes and the low-expansion through electrodes are arranged in a cyclic and symmetric manner.

(8) The wiring board according to any of (5) to (7), in which the normal through electrodes and the low-expansion through electrodes are alternately arranged at corners of squares arranged in horizontal and vertical directions.

(9) The wiring board according to any of (5) to (7), in which the normal through electrodes and the low-expansion through electrodes are alternately arranged at corners and centers of regular hexagons arranged without space.

(10) The wiring board according to any of (1) to (9), further including
a heat-release through electrode formed with the through hole filled with one of a carbon-based material and a metal material, the one of the carbon-based material and the metal material having a low thermal expansion rate and a higher thermal conductivity than a thermal conductivity of glass.

(11) The wiring board according to (10), in which the carbon-based material is carbon nanotube.

(12) The wiring board according to any of (1) to (11), further including
a magnetic through electrode formed with the through hole filled with a magnetic material.

(13) The wiring board according to (12), in which the magnetic material is one of an iron oxide, a chromium oxide, cobalt, and a ferrite.

(14) A wiring board manufacturing method including:
a through hole formation step of forming a plurality of through holes arranged in a cyclic manner in a glass substrate serving as a core member; and
a filling step of forming a protecting sheet on the glass substrate, and filling the through holes with a filling material through an opening formed in the protecting sheet, the protecting sheet being formed for each kind of filling materials to fill the through holes, each protecting sheet having an opening only for the through holes to be filled with the corresponding one of the filling materials.

REFERENCE SIGNS LIST

20 Through-electrode-equipped wiring board
21 Glass substrate
22 Heat-release through electrode
23 Low-expansion through electrode
24 Normal through electrode
25 Magnetic through electrode
51 Heat release plate
62 Molded resin
71 Coil
72 Communication IC

What is claimed is:

1. A wiring board comprising:
a glass substrate as a core member;
a plurality of through holes arranged in a cyclic manner in the glass substrate, wherein the through holes are filled with different kinds of filling materials, and wherein through hole groups each formed with the plurality of through holes filled with different kinds of filling materials are arranged in a cyclic manner in the glass substrate;
a plurality of normal through electrodes formed with through holes not included in the plurality of holes that are filled with a first conductive material; and
a plurality of low-expansion through electrodes formed with through holes included in the plurality of through holes that are filled with a second conductive material, the second conductive material having a linear expansion coefficient closer to a linear expansion coefficient of glass than to a linear expansion coefficient of the first conductive material, wherein the normal through electrodes and the low-expansion through electrodes are arranged in a cyclic and symmetric manner, and wherein the normal through electrodes and the low-expansion through electrodes are alternately arranged at corners of squares arranged in horizontal and vertical directions.

2. The wiring board according to claim 1, further comprising a dummy through electrode formed with the through hole not filled with a conductive material.

3. The wiring board according to claim 1, wherein
the first conductive material is Cu, and
the second conductive material is W.

4. The wiring board according to claim 1, further comprising a heat-release through electrode formed with a through hole filled with one of a carbon-based material and a metal material, the one of the carbon-based material and the metal material having a higher thermal conductivity than a thermal conductivity of glass.

5. The wiring board according to claim 4, wherein the carbon-based material is carbon nanotube.

6. The wiring board according to claim 1, further comprising
a magnetic through electrode formed with the through hole filled with a magnetic material.

7. The wiring board according to claim 6, wherein the magnetic material is one of an iron oxide, a chromium oxide, cobalt, and a ferrite.

8. A wiring board comprising:
a glass substrate as a core member;
a plurality of through holes arranged in a cyclic manner in the glass substrate, wherein the through holes are filled with different kinds of filling materials, and wherein through hole groups each formed with the plurality of through holes filled with different kinds of filling materials are arranged in a cyclic manner in the glass substrate;
a plurality of normal through electrodes formed with through holes included in the plurality of through holes that are filled with a first conductive material; and
a plurality of low-expansion through electrodes formed with through holes included in the plurality of through holes that are filled with a second conductive material, the second conductive material having a linear expansion coefficient closer to a linear expansion coefficient of glass than to a linear expansion coefficient of the first conductive material, wherein the normal through electrodes and the low-expansion through electrodes are arranged in a cyclic and symmetric manner, and wherein the normal through electrodes and the low-expansion through electrodes are alternately arranged at corners and centers of regular hexagons arranged without space.

9. The wiring board according to claim 8, further comprising a heat-release through electrode formed with a through hole filled with one of a carbon-based material and a metal material, the one of the carbon-based material and the metal material having a higher thermal conductivity than a thermal conductivity of glass.

10. The wiring board according to claim 9, wherein the carbon-based material is carbon nanotube.

11. The wiring board according to claim 8, further comprising
a magnetic through electrode formed with a through hole filled with a magnetic material.

12. The wiring board according to claim 11, wherein the magnetic material is one of an iron oxide, a chromium oxide, cobalt, and a ferrite.

13. The wiring board according to claim 8, further comprising a dummy through electrode formed with a through hole not filled with filling conductivity.

14. The wiring board according to claim 8, wherein
the first conductive material is Cu, and
the second conductive material is W.

* * * * *